(12) United States Patent
Lee

(10) Patent No.: US 8,659,962 B2
(45) Date of Patent: Feb. 25, 2014

(54) SEMICONDUCTOR DEVICE, SEMICONDUCTOR SYSTEM HAVING THE SAME AND OPERATING METHOD THEREOF

(75) Inventor: Jeong-Hun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 111 days.

(21) Appl. No.: 13/404,446

(22) Filed: Feb. 24, 2012

(65) Prior Publication Data

US 2013/0114351 A1    May 9, 2013

(30) Foreign Application Priority Data

Nov. 8, 2011 (KR) .......................... 10-2011-0116017

(51) Int. Cl.
- *G11C 7/00* (2006.01)
- *G11C 7/06* (2006.01)
- *G11C 7/10* (2006.01)
- *G11C 8/00* (2006.01)

(52) U.S. Cl.
USPC ................. 365/201; 365/189.05; 365/189.07; 365/236

(58) Field of Classification Search
USPC .................... 365/189.05, 189.07, 201, 236
See application file for complete search history.

(56) References Cited

U.S. PATENT DOCUMENTS

| | | | | |
|---|---|---|---|---|
| 6,330,200 | B2* | 12/2001 | Ooishi | 365/201 |
| 6,940,777 | B2* | 9/2005 | Ooishi | 365/226 |
| 2001/0013110 | A1* | 8/2001 | Pierce et al. | 714/718 |
| 2010/0067312 | A1* | 3/2010 | Lee et al. | 365/189.07 |
| 2012/0266034 | A1* | 10/2012 | Shin | 714/719 |

FOREIGN PATENT DOCUMENTS

KR    1020100076656    7/2010

* cited by examiner

*Primary Examiner* — Ly D Pham
(74) *Attorney, Agent, or Firm* — IP & T Group LLP

(57) ABSTRACT

A semiconductor device includes a data storage unit configured to receive input data, outputs the input data with a difference in voltage level between logic levels, and output comparison data whose logic level is distinguished from the input data; a test operation unit configured to determine a logic level of test data periodically in response to a data reference voltage whose voltage level is determined in response to a level test code during a test operation period defined by a test entry command and a test exit command, and generate a test result signal by comparing a logic level of the comparison data with the logic level of the test data; and a test operation sensing signal generation unit configured to generate a test operation sensing signal that is activated in response to the test entry command and inactivated in response to the test result signal.

24 Claims, 6 Drawing Sheets

SEMICONDUCTOR DEVICE, SEMICONDUCTOR SYSTEM HAVING THE SAME AND OPERATING METHOD THEREOF

CROSS-REFERENCE TO RELATED APPLICATIONS

The present application claims priority of Korean Patent Application No. 10-2011-0116017, filed on Nov. 8, 2011, which is incorporated herein by reference in its entirety.

BACKGROUND

1. Field

Exemplary embodiments of the present invention relate to a semiconductor design technology, and more particularly, to a semiconductor device for generating a data reference voltage in the semiconductor device, a semiconductor system including the semiconductor device, and an operating method thereof.

2. Description of the Related Art

In a low-power and high-speed semiconductor device, such as a double data rate type four (DDR4) memory device, a training test of a data reference voltage VREF_DQ that defines a reference voltage level of a data input buffer is performed in the semiconductor device.

To perform the training test, a semiconductor controller provides a 6-bit level training code to the semiconductor device, and the semiconductor device generates the data reference voltage VREF_DQ in the semiconductor device by adjusting the level of the data reference voltage VREF_DQ in response to the 6-bit level training code.

In a conventional semiconductor device, the semiconductor controller generates the data reference voltage VREF_DQ and provides the generated data reference voltage VREF_DQ to the semiconductor device. However, in the configuration described above, the data reference voltage VREF_DQ is generated in the semiconductor device, and as a result, a parameter outside of the semiconductor device is to be sensed so that a result of the training test can be obtained. For example, the result of the training test may be a time taken until the data reference voltage VREF_DQ reaches a target level.

When the parameter is directly sensed, the measured parameter may not be accurate due to capacitive and loading elements of a monitoring pad and sensing equipment.

More specifically, although the parameter is measured using a small unit such as a nanosecond, sensing the parameter not in the semiconductor device is difficult to accurately measure.

Therefore, when the data reference voltage VREF_DQ is not normally generated in the semiconductor device, the data reference voltage VREF_DQ may not be accurately sensed.

SUMMARY

An embodiment of the present invention is directed to a semiconductor device that operates to accurately sense a parameter, such as a time when a data reference voltage reaches a target level, a semiconductor system having the semiconductor device, and an operating method thereof.

Another embodiment of the present invention is directed to a semiconductor device that enables a stable sensing operation to be performed even when the operating frequency of the semiconductor device is very high, a semiconductor system having the semiconductor device, and an operating method thereof.

In accordance with an embodiment of the present invention, a semiconductor device includes a data storage unit configured to receive input data, outputs the input data with a first difference in voltage level between logic levels, and output comparison data whose logic level is distinguished from that of the input data; a test operation unit configured to determine a logic level of test data periodically in response to a data reference voltage whose voltage level is determined in response to a level test code during a test operation period defined by a test entry command and a test exit command, and generate a test result signal by comparing a logic level of the comparison data with the logic level of the test data; and a test operation sensing signal generation unit configured to generate a test operation sensing signal that is activated in response to the test entry command and inactivated in response to the test result signal.

In accordance with another embodiment of the present invention, a semiconductor system includes a semiconductor controller configured to output comparison data during a test preparation operation period, output a level test code whose value is periodically changed and test data during a test operation period, and sense a time taken for the level test code to reach a target value in response to an output signal of a semiconductor device; and the semiconductor device configured to store a logic level of the comparison data during the test preparation operation period, determine a voltage level of a data reference voltage in response to the level test code during the test operation period, decide a logic level of the test data in response to the data reference voltage, and generate the output signal by comparing the logic level of the test data with the logic level of the comparison data.

In accordance with still another embodiment of the present invention, a method for operating a semiconductor system includes entering a test preparation period of a semiconductor device in response to a test preparation entry command, comparison data, and a test preparation exit command from a semiconductor controller, storing the comparison data by controlling logic levels of the comparison data in the semiconductor device, and exiting from the test preparation operation period of the semiconductor device; outputting a test entry command from the semiconductor controller, outputting a level test code having a value that is periodically changed and test data corresponding to the number of periods from the semiconductor controller, and outputting a test exit command from the semiconductor controller after a test operation of outputting a test entry command; periodically determining a voltage level of a data reference voltage in the semiconductor device in response to the level test code and the test data in a test operation period that is defined in response to the test entry command and the test exit command, deciding a logic level of the test data based on the data reference voltage in the semiconductor device, and outputting a test operation sensing signal from the semiconductor device by comparing the logic level of the test data with the comparison data; and determining a time taken until the value of the level test code reaches a target value in the semiconductor controller in response to the test operation sensing signal.

DETAILED DESCRIPTION

Figure 1A:
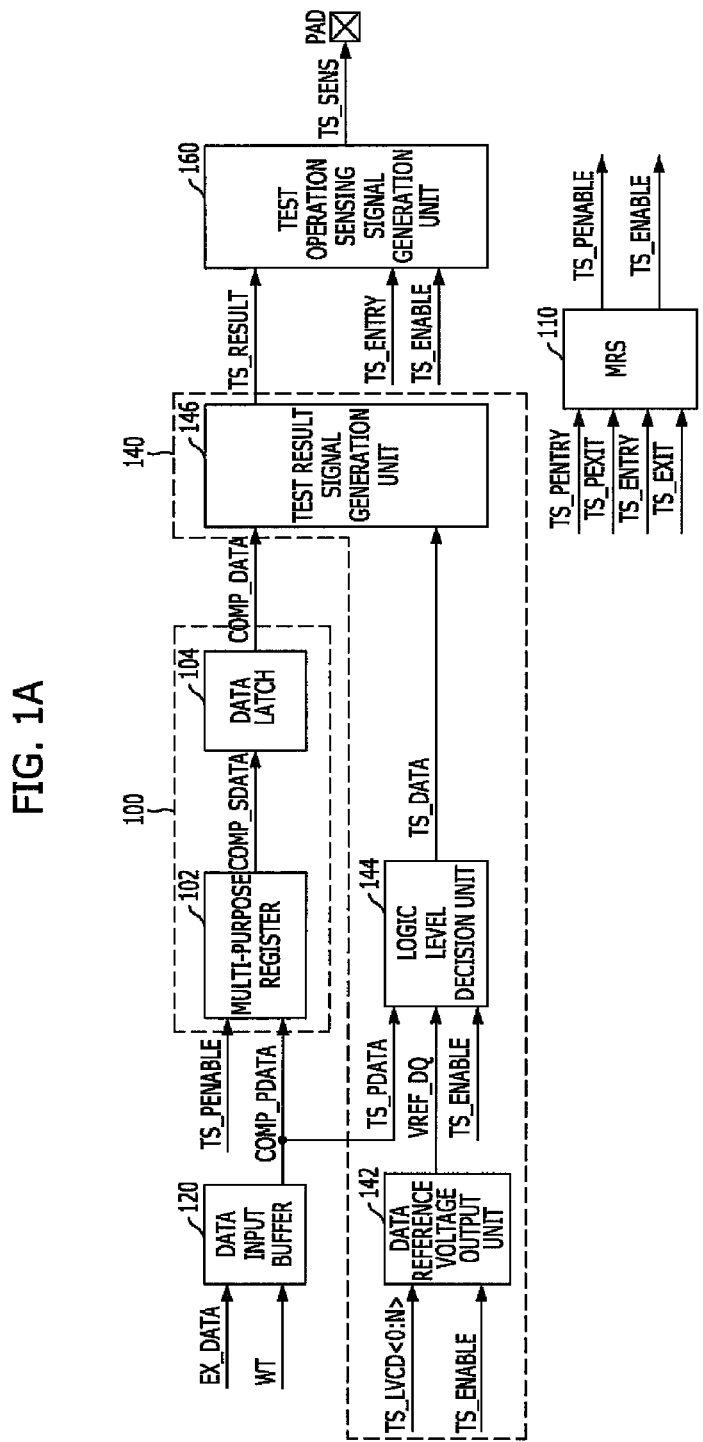
FIGS. 1A and 1B are block diagrams illustrating configurations of semiconductor devices in accordance with embodiments of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1B:
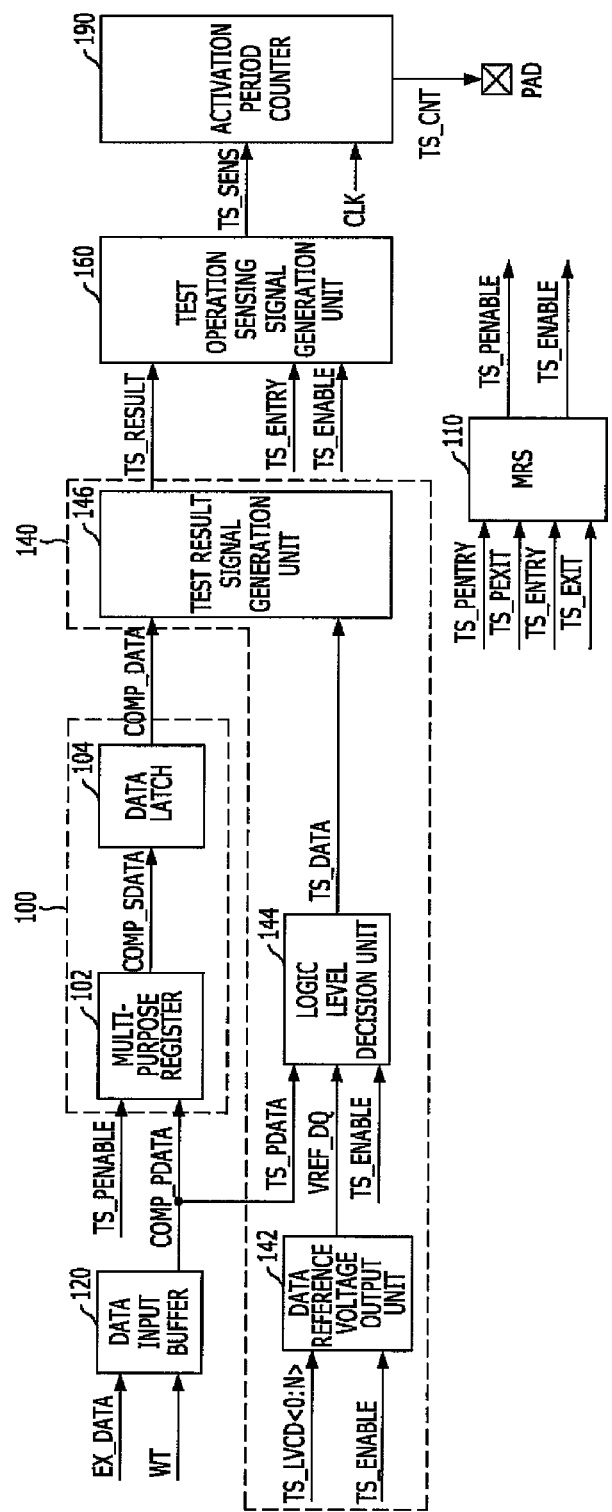
Figure 1C:
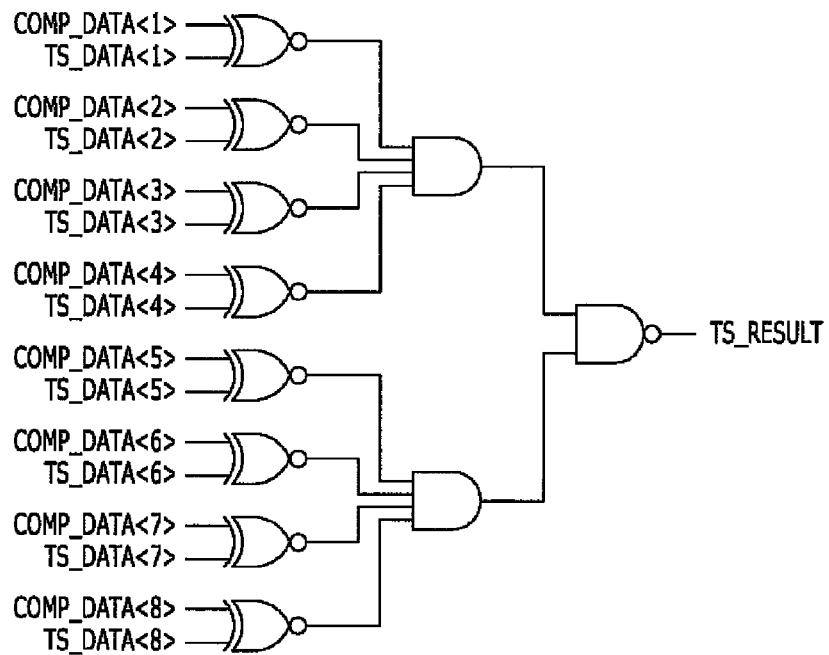
FIG. 1C is a circuit diagram illustrating a test result signal generation unit illustrated in FIGS. 1A and 1B.
Figure 1D:
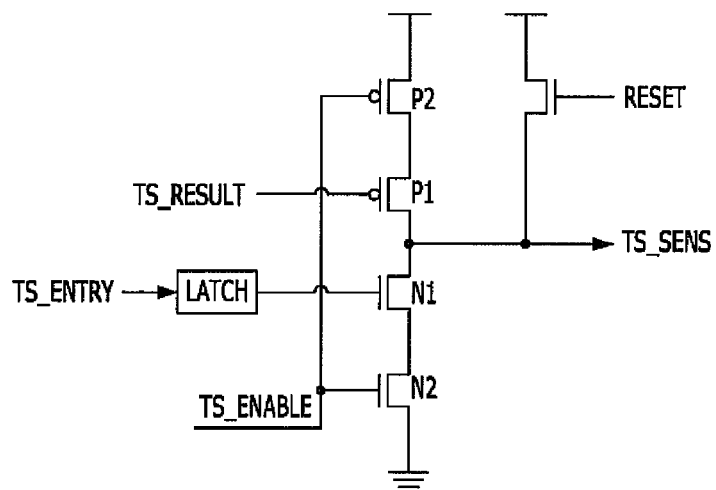
FIG. 1D is a circuit diagram illustrating a test operation sensing signal generation unit illustrated in FIGS. 1A and 1B.

FIGS. 1A and 1B are block diagrams illustrating configurations of semiconductor devices in accordance with embodiments of the present invention. FIG. 1C is a circuit diagram specifically illustrating a test result signal generation unit illustrated in FIGS. 1A and 1B. FIG. 1D is a circuit diagram illustrating a test operation sensing signal generation unit illustrated in FIGS. 1A and 1B.

Referring to FIG. 1A, the semiconductor device in accordance with the embodiment of the present invention includes a data storage unit 100, a test operation unit 140, a test operation sensing signal generation unit 160, a data input buffer 120, and a mode register set (MRS) 110.

The MRS 110 defines a test preparation operation period by generating a test preparation enable signal TS_PENABLE. The test preparation enable signal TS_PENABLE is activated in response to a test preparation entry command TS_PENTRY and a test preparation exit command TS_PEXIT, which are applied from a circuit outside of the semiconductor device. Further, the MRS 110 defines a test operation period by generating a test enable signal TS_ENABLE. The test enable signal TS_ENABLE is activated in response to a test entry command TS_ENTRY and a test exit command TS_EXIT, which are applied from a circuit outside of the semiconductor device.

The data input buffer 120 buffers data EX_DATA applied from a circuit outside of the semiconductor device in response to a data input command WT applied from a circuit outside of the semiconductor device. The data outputted from the data input buffer 120 becomes comparison data COMP_PDATA in the test preparation operation period, and the data outputted from the data input buffer 120 becomes test data TS_PDATA in the test operation period. More specifically, the data outputted from the data input buffer 120 is comparison data COMP_PDATA or the test data TS_PDATA according to when the data is applied. Practically, the comparison data COMP_PDATA and the test data TS_PDATA are data having the same data pattern.

The data storage unit 100 receives the comparison data COMP_PDATA and outputs the received comparison data COMP_PDATA the input data with a first difference in voltage level between logic levels so that a logic level of the data is distinguished from that of the comparison data COMP_PDATA.

In detail, the data storage unit 100 includes a multi-purpose register 102 and a data latch 104.

The multi-purpose register 102 stores the comparison data COMP_PDATA, which has the data pattern set in the test preparation operation period, and the multi-purpose register 102 outputs the comparison data COMP_PDATA as comparison data COMP_SDATA. For reference, the test preparation operation period is a period where the test preparation enable signal TS_PENABLE is activated, and the test preparation enable signal TS_PENABLE is activated by the test preparation entry command TS_PENTRY and the test preparation exit command TS_PEXIT.

The data latch 104 latches the comparison data COMP_SDATA, which outputs the input data with a difference in voltage level between a power voltage VDD and a ground voltage VSS so that a logic level of latched comparison data COMP_DATA is distinguished from that of the comparison data COMP_SDATA. The outputting of the input data with a difference in voltage level between a power voltage VDD and a ground voltage VSS may be called a swing in voltage level.

For reference, the comparison data may be divided into the comparison data COMP_PDATA, the comparison data COMP_PDATA stored in the multi-purposed register 102, and the comparison data COMP_DATA latched through the data latch 104. These three comparison signals are for illustration purposes according to operation processes, and values of the three comparison signals are identical to one another. Hence, the three comparison data signals will be referred to as comparison data COPM_DATA in the following description. The comparison data COMP_DATA may be a signal including a plurality of bits.

The test operation unit 140 determines a logic level of the test data TS_PDATA and outputs test data TS_DATA in response to a logic level of a data reference voltage VREF_DQ during the test operation period. The data reference VREF_DQ has a voltage level that is determined in response to a level test code TS_LVCD<0:N> applied from a circuit outside of the semiconductor device. For reference, the test operation period is a period where the test enable signal TS_ENABLE is activated. Further, the test operation unit 140 generates a test result signal TS_RESULT by comparing a logic level of the comparison data COMP_DATA with a logic level of the test data TS_DATA.

In detail, the test operation unit 140 includes a data reference voltage output unit 142, a logic level decision unit 144, and a test result signal generation unit 146.

The data reference voltage output unit 142 determines the voltage level of the reference voltage VREF_DQ between a minimum voltage level, which is higher than the ground voltage VSS, and a maximum voltage level, which is lower than that of the power voltage VDD, in response to the level test code TS_LVCD<0:N> applied from a circuit outside of the semiconductor device during the test operation period. The minimum voltage level and the maximum voltage level may be changed and set to different values. For example, when the level test code TS_LVCD<0:N> is composed of a 6-bit code TS_LVCD<0:5> and has a minimum value, i.e., TS_LVCD<0:5>='000000', the data reference voltage output unit 142 sets the voltage level of the reference voltage VREF_DQ as the minimum voltage level. When the level test code TS_LVCD<0:N> has a maximum value, i.e., TS_LVCD<0:5>='111111', the data reference voltage output unit 142 sets the voltage level of the reference voltage VREF_DQ as the maximum voltage level. If the level test code TS_LVCD<0:N> has a middle value between the maximum and minimum values, e.g., TS_LVCD<0:5>='011111', the data reference voltage output unit 142 sets the voltage level of the reference voltage VREF_DQ as a voltage level obtained by halving the sum of the maximum voltage level and the minimum voltage level.

The logic level decision unit 144 determines a logic level of test data TS_PDATA applied every time period set in the test operation period when the test enable signal TS_ENABLE is activated in response to the voltage level of the reference voltage VREF_DQ, and the logic level decision unit 144 outputs test data TS_DATA.

More specifically, when the voltage level of the test data TS_PDATA is higher than that of the data reference voltage VREF_DQ, the logic level decision unit 144 sets the logic level of the outputted test data TS_DATA to be a logic high level. When the voltage level of the test data TS_PDATA is lower than that of the data reference voltage VREF_DQ, the logic level decision unit 144 sets the logic level of the outputted test data TS_DATA to be a logic low level.

The operations of the data reference voltage output unit 142 and the logic level decision unit 144 will be described together.

As the value of the level test code TS_LVCD<0:N> is changed, the data reference voltage output unit 142 also changes the voltage level of the data reference voltage VREF_DQ, and the logic level decision unit 144 determines the logic level of the test data TS_DATA in response to the voltage level of the data reference voltage VREF_DQ.

Therefore, the logic level of the test data TS_DATA may be changed depending on the value of the level test code TS_LVCD<0:N>.

For reference, the test data may be classified into the test data TS_PDATA, which is applied from the data input buffer 120, and the test data TS_DATA, which has a logic level determined by the logic level decision unit 144. The two test data signals will be referred to as test data TS_DATA in the following description. The test data TS_DATA may be a signal including a plurality of bits.

The test result signal generation unit 146 generates the test result signal TS_RESULT activated when the logic level of the test data TS_DATA outputted from the logic level decision unit 144 is identical to that of the comparison data COMP_DATA stored in the data storage unit 100.

Referring to FIG. 1C, a detailed circuit of the test result signal generation unit 146 will be described.

Referring to FIG. 1C, when each of bits TS_DATA<1>, TS_DATA<2>, TS_DATA<3>, TS_DATA<4>, TS_DATA<5>, TS_DATA<6>, TS_DATA<7>, and TS_DATA<8> of the test data TS_DATA is respectively identical to each of bits COMP_DATA<1>, COMP_DATA<2>, COMP_DATA<3>, COMP_DATA<4>, COMP_DATA<5>, COMP_DATA<6>, COMP_DATA<7>, and COMP_DATA<8> of the comparison data COMP_DATA, the test result signal generation unit 146 activates the test result signal TS_RESULT initialized in an inactivation state.

For reference, FIG. 1C illustrates that each of the test data TS_DATA and the comparison data COMP_DATA is a signal composed of 8 bits. However, the circuit may be modified if the test data or the comparison data is a signal having more than 8 bits or less than 8 bits.

Although FIG. 1C illustrates that the bits of the test data TS_DATA are directly compared with those of the comparison data COMP_DATA, respectively, any comparison method may be included in the scope of the present invention as long as the comparison method is one in which the logic level of the test data TS_DATA can be compared with that of the comparison data COMP_DATA. For example, a method of comparing a result obtained by compressing the test data TS_DATA composed of a plurality of bits with that obtained by compressing the comparison data COMP_DATA composed of a plurality of bits may be included in the scope of the present invention.

The operations of the data reference voltage output unit 142, the logic level decision unit 144, and the test result signal generation unit 146 will be described together.

As the value of the level test code TS_LVCD<0:N> is changed, the data reference voltage output unit 142 also changes the voltage level of the data reference voltage VREF_DQ, and the logic level decision unit 144 determines the logic level of the test data TS_DATA in response to the voltage level of the data reference voltage VREF_DQ. The test result signal generation unit 146 compares the logic level of the test data TS_DATA with the logic level of the comparison data COMP_DATA and activates the test result signal TS_RESULT when the test data TS_DATA and the comparison data COMP_DATA are identical.

When the test data TS_DATA and the comparison data COMP_DATA are inputted from the data input buffer 120 as described above, the test data TS_DATA and the comparison data COMP_DATA have a same data pattern. Thus, when comparing voltage-level swing patterns of the test data TS_DATA and the comparison data COMP_DATA, the voltage-level swing patterns are identical to each other.

However, since the voltage-level swing of the comparison data COMP_DATA is made between the level of the power voltage VDD and the level of the ground voltage VSS, the logic level of the comparison data COMP_DATA is correctly decided. On the other hand, since the logic level of the test data TS_DATA is decided based on the voltage level of the data reference voltage VREF_DQ, which is fluctuated in response to the level test code TS_LVCD<0:N>, the logic level of the test data TS_DATA may be have a different value than the comparison data COMP_DATA depending on the value of the level test code TS_LVCD<0:N>.

Therefore, where the comparison data COMP_DATA and the test data TS_DATA, which have had the same voltage-level swing pattern, have different logic levels, the voltage level of the data reference voltage VREF_DQ for deciding the logic level of the test data TS_DATA is in an incorrect state. On the contrary, where the comparison data COMP_DATA and the test data TS_DATA, which have had the same voltage-level swing pattern, have the same logic level, the voltage level of the data reference voltage VREF_DQ for deciding the logic level of the test data TS_DATA is in a correct state.

More specifically, when the test result signal TS_RESULT outputted from the test result signal generation unit 146 is not activated, the data reference voltage VREF_DQ has an abnormal level. On the contrary, when the test result signal TS_RESULT outputted from the test result signal generation unit 146 is activated, the data reference voltage VREF_DQ has a normal level.

In other words, when the test result signal TS_RESULT outputted from the test result signal generation unit 146 is not activated, the level test code TS_LVCD<0:N> has an abnormal value. On the contrary, when the test result signal TS_RESULT outputted from the test result signal generation unit 146 is activated, the level test code TS_LVCD<0:N> has a normal value.

The test operation sensing signal generation unit 160 generates a test operation sensing signal TS_SENS that is activated in response to the test entry command TS_ENTRY and inactivated in response to the test result signal TS_RESULT.

Referring to FIG. 1D, a detailed circuit of the test operation sensing signal generation unit 160 will be described. Specifically, the test operation sensing signal generation unit 160 includes PMOS transistors P1 and P2 and NMOS transistors N1 and N2. The PMOS transistors P1 and P2 determine that the test operation sensing signal TS_SENS is inactivated to a logic high level in response to the test result signal TS_RESULT in the test operation period when the test enable signal TS_ENABLE is activated. The NMOS transistors N1 and N2 determine that the test operation sensing signal TS_SENS is activated to a logic low level in response to the test entry command TS_ENTRY in the test operation period when the test enable signal TS_ENABLE is activated.

Thus, the test operation sensing signal generation unit 160 allows the test operation sensing signal TS_SENS, which is inactivated to a logic high level in an initial state, to be activated to a logic low level in response to the test entry command TS_ENTRY toggled to a logic high level. Further, the test operation sensing signal generation unit 160 allows the test operation sensing signal TS_SENS to be inactivated to a logic high level in response to the test result signal TS_RESULT toggled to a logic low level.

A transition of the test operation sensing signal TS_SENS from an activation state of a logic low level to an inactivation state of a logic high level means that the data reference voltage VREF_DQ is changed from the state where the data reference voltage VREF_DQ has an abnormal level to the state where the data reference voltage VREF_DQ has a normal level.

In other words, the transition of the test operation sensing signal TS_SENS from the activation state of a logic low level to the inactivation state of a logic high level means that the level test code TS_LVCD<0:N> is changed from the state where the level test code TS_LVCD<0:N> has an abnormal value to the state where the level test code TS_LVCD<0:N> has a normal value.

Since the test operation sensing signal TS_SEN is activated to a logic low level at the time when the test entry command TS_ENTRY is toggled to a logic high level, the period from the point in time when the test operation sensing signal TS_SENS is activated to a logic low level to the point in time when test operation sensing signal TS_SENS is inactivated to a logic high level is a period when a training test is performed on the value of the level test code TS_LVCD<0:N> and the level of the data reference voltage VREF_DQ.

The training test is performed to identify which value of the level test code TS_LVCD<0:N> has as the normal value while sequentially changing the value of the level test code TS_LVCD<0:N> within a range of values.

Similarly, the training test is performed to identify which voltage level of the data reference voltage VREF_DQ has the normal voltage level while sequentially changing the voltage of the data reference voltage VREF_DQ within a specific range of voltage levels.

As a result, the length of the activation period of the test operation sensing signal TS_SENS may be a time when the voltage level of the data reference voltage VREF_DQ reaches a target level through the training test.

The method for sensing the length of the test operation sensing signal TS_SENS may be illustrated using the following two methods.

First, as illustrated in FIG. 1A, the test operation sensing signal TS_SENS is outputted to a circuit outside of the semiconductor device through a set output pad PAD. In this method, the length that the test operation sensing signal TS_SENS is activated is sensed using specific test equipment.

As illustrated in FIG. 1B, the number of times when a source clock CLK is toggled during the activation period of the test operation sensing signal TS_SENS is counted through an activation period counter 190 and subsequently the counted value is outputted to a circuit outside of the semiconductor device through the set output pad PAD. In this method, the length that the test operation sensing signal TS_SENS is activated is sensed through the counted value.

Figure 2:
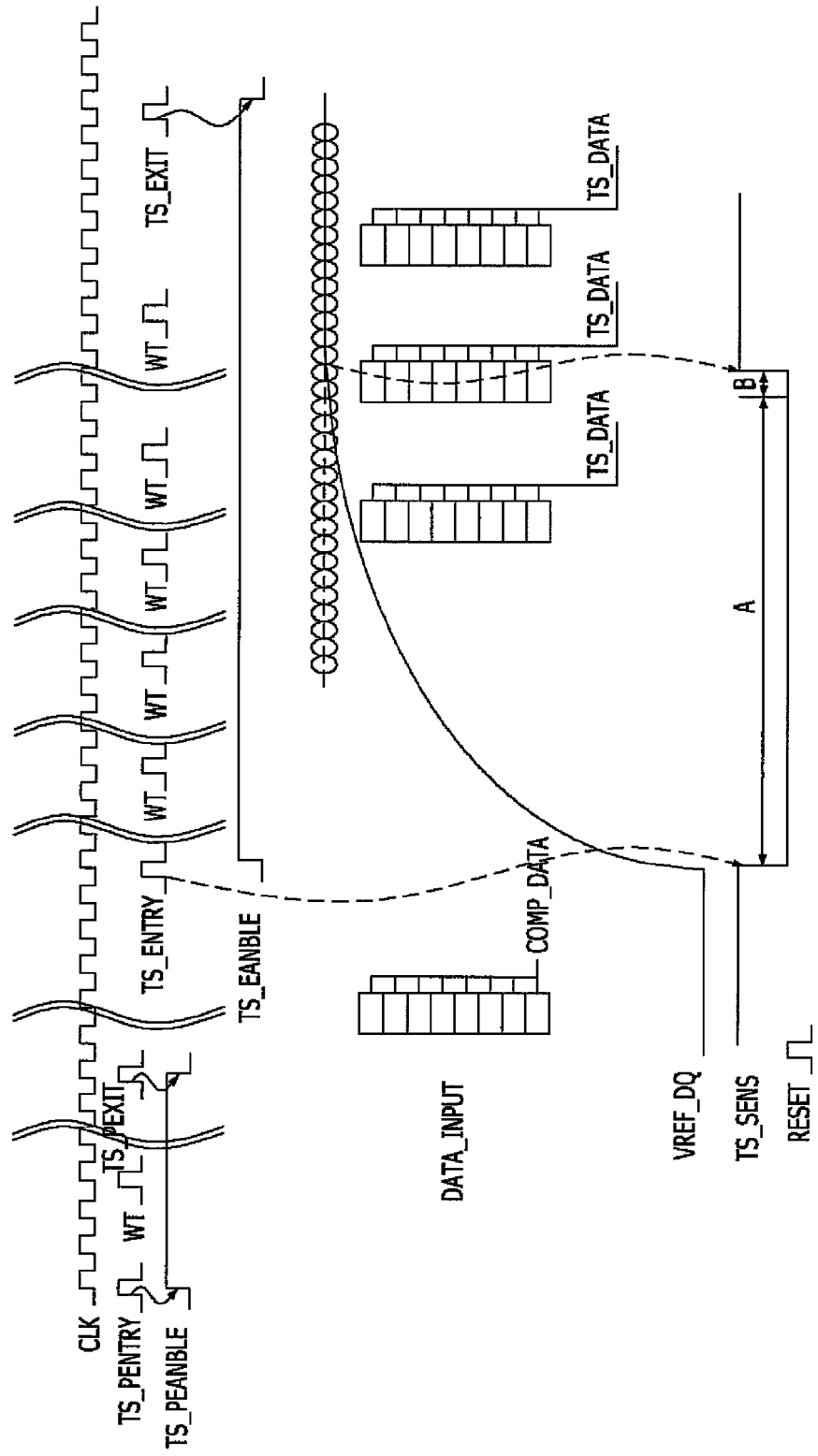
FIG. 2 is a timing diagram illustrating operations of the semiconductor devices illustrated in FIGS. 1A to 1D in accordance with the embodiments of the present invention.

FIG. 2 is a timing diagram illustrating operations of the semiconductor devices illustrated in FIGS. 1A to 1D in accordance with the embodiments of the present invention.

Referring to FIG. 2, each of the semiconductor devices illustrated in FIGS. 1A to 1D in accordance with the embodiments of the present invention enters in the test preparation operation period when the test enable signal TS_PENABLE is activated in response to the toggling of the test preparation entry command TS_PENTRY, and the semiconductor devices exits from the test preparation operation period in response to the toggling of the test preparation exit command TS_PEXIT.

As such, the comparison data COMP_DATA is applied through the data input buffer 120 in response to the toggling of the data input command WT in the test preparation operation period, which is defined by the test preparation entry command TS_PENTRY and the test preparation exit command TS_PEXIT.

The semiconductor device enters the test operation period in response to the toggling of the test entry command TS_ENTRY, and the semiconductor device exits from the test operation period in response to the toggling of the test exit command TS_EXIT.

As such, the test data TS_DATA is applied through the data input buffer 120 in response to the toggling of the data input command WT at set points in time in the test operation period.

The voltage level of the data reference voltage VREF_DQ rises in the test operation period. More specifically, although not directly illustrated in FIG. 2, as the value of the level test code TS_LVCD<0:N> sequentially increases toward a target value from, the minimum value, the voltage level of the data reference voltage VREF_DQ also rises toward a target level from the set minimum level.

The logic level of the test data TS_DATA is decided in response to the voltage level of the data reference voltage VREF_DQ. As a result, the logic level of the test data TS_DATA cannot be normally decided in the state where the voltage level of the data reference voltage VREF_DQ is close to the minimum level. However, as the voltage level of the data reference voltage VREF_DQ reaches the target level while continuously rising, the logic level of the test data TS_DATA can be normally decided. If the voltage level of the data reference voltage VREF_DQ reaches the target level, the logic levels of all the test data TS_DATA can be correctly decided.

Additionally, the test operation sensing signal TS_SENS is initialized as a logic high level in response to a reset signal RESET and is subsequently activated to a logic low level in response to the test entry command TS_ENTRY. More specifically, the test entry command TS_ENTRY is activated to a logic low level at a point in time when the voltage level of the data reference voltage VREF_DQ starts increasing.

Subsequently, the test operation sensing signal TS_SENS is inactivated to a logic high level in response to the voltage level of the data reference voltage VREF_DQ, which reaches the target level by increasing. More specifically, the test operation sensing signal TS_SENS is inactivated to a logic high level when the logic level of the test data TS_DATA is identical to that of the comparison data COMP_DATA after the point in time when the voltage level of the data reference voltage VREF_DQ reaches the target level.

Thus, the activation period of the test operation sensing signal TS_SENS is a period from the point in time when the voltage level of the data reference voltage VREF_DQ is changed to the point in time when the voltage level of the data reference voltage VREF_DQ reaches the target level.

In other words, the activation period of the test operation sensing signal TS_SENS is a period from the point in time when the value of the level test code TS_LVCD<0:N> is changed to the point in time when the value of the level test code TS_LVCD<0:N> reaches the target value.

For illustration purposes, the length of the activation period of the test operation sensing signal TS_SENS, illustrated in FIG. 2, is divided into period 'A' and period 'B'. Here, the period 'B' represents a delay time taken until the test data TS_DATA is inputted in response to the application of the data input command WT. The delay time is a value capable of being calculated in advance.

Hence, the period from the point in time when the voltage level of the data reference voltage VREF_DQ is changed to the point in time when the voltage level of the data reference voltage VREF_DQ reaches the target level is a period obtained by a length corresponding to the period 'B' from the length of the activation period of the test operation sensing signal TS_SENS.

In other words, the period from the point in time when the value of the level test code TS_LVCD<0:N> is changed to the point in time when the value of the level test code TS_LVCD<0:N> reaches the target value is a period obtained by a length corresponding to the period B from the length of the activation period of the test operation sensing signal TS_SENS.

Figure 3A:
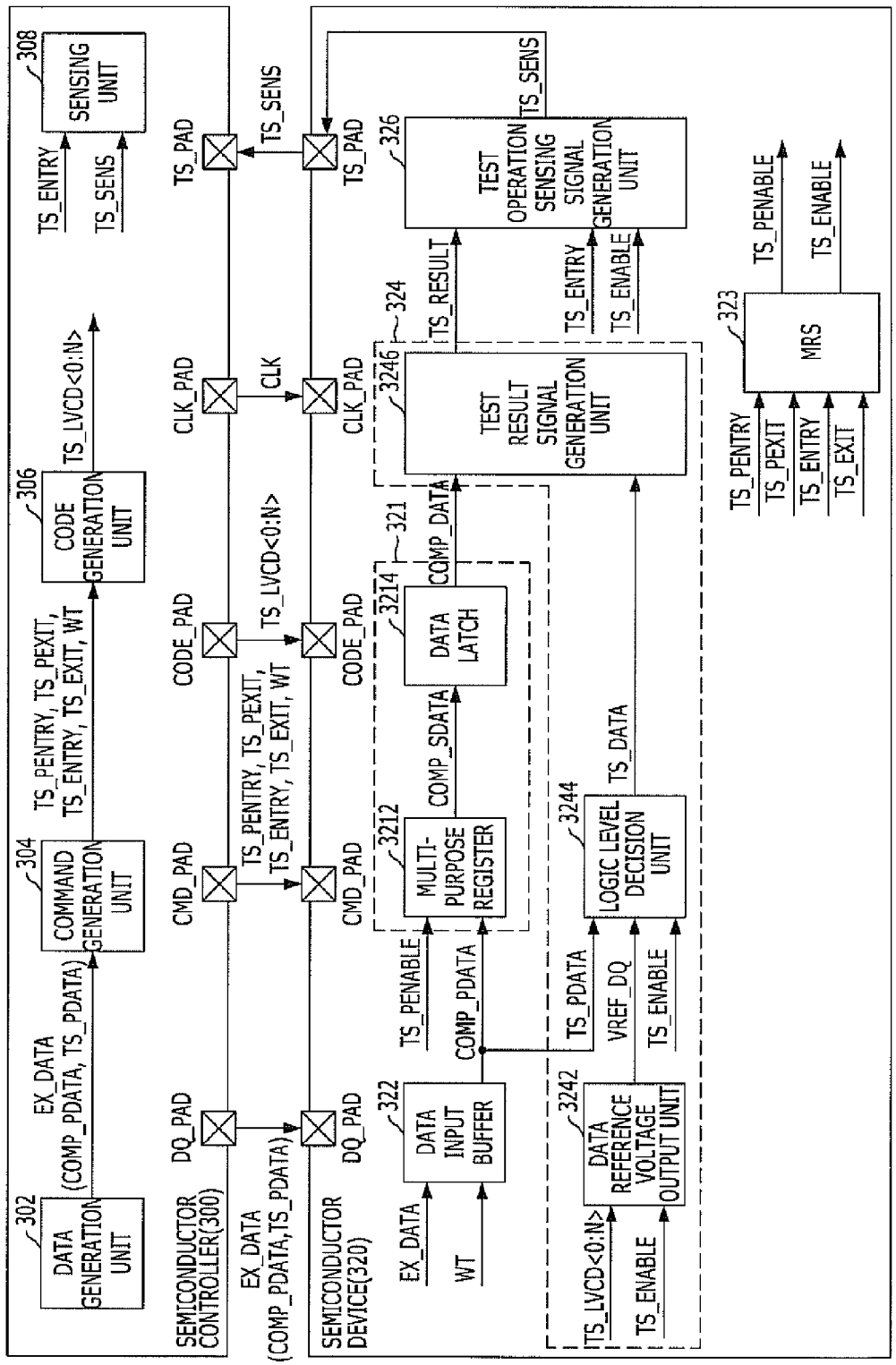
FIGS. 3A and 3B are block diagrams illustrating semiconductor systems having the semiconductor devices illustrated in FIGS. 1A and 1B in accordance with embodiments of the present invention.
Figure 3B:
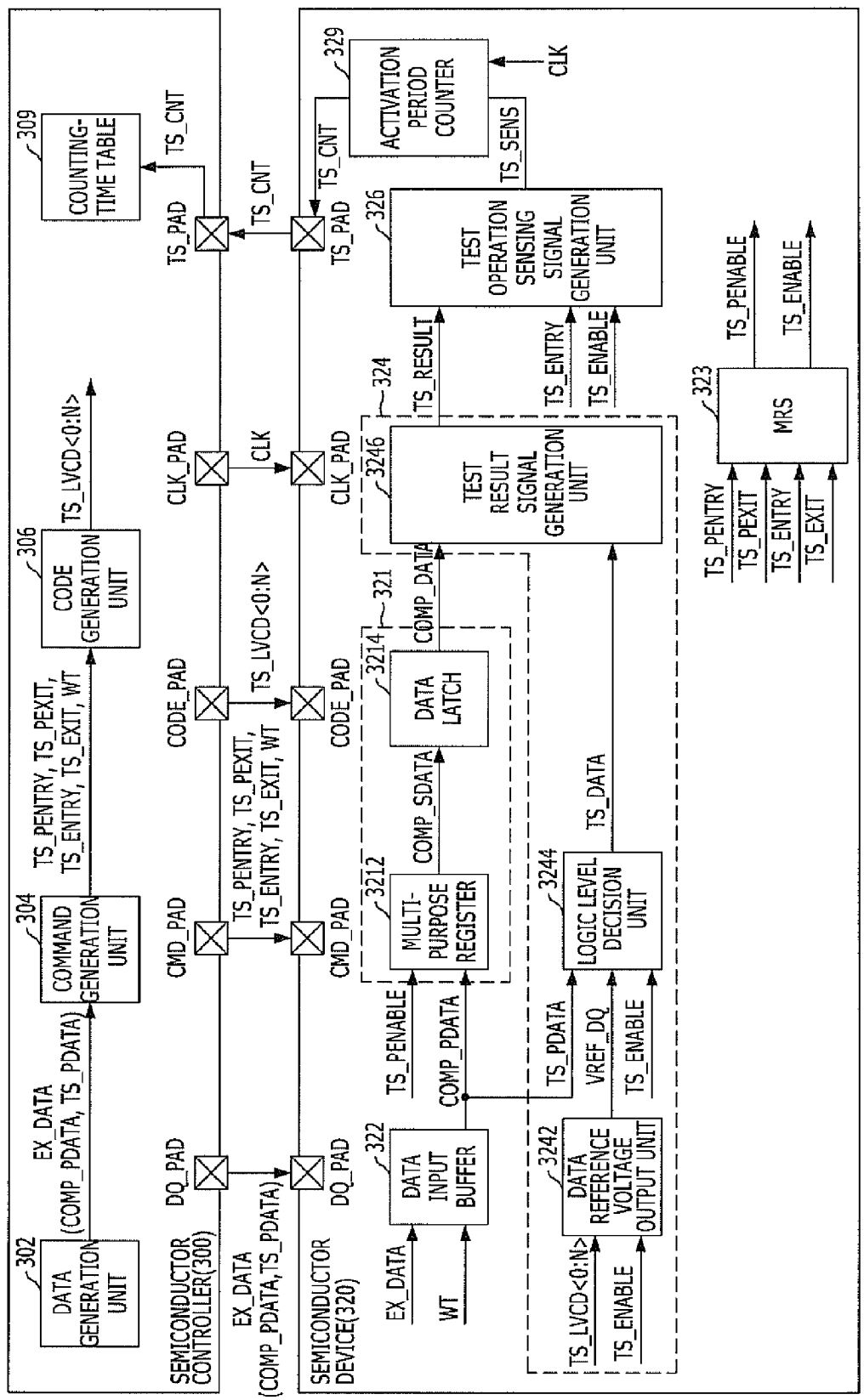

FIGS. 3A and 3B are block diagrams illustrating semiconductor systems having the semiconductor devices illustrated in FIGS. 1A and 1B in accordance with embodiments of the present invention.

Referring to FIG. 3A, the semiconductor system in accordance with the embodiment of the present invention includes a semiconductor controller 300 and a semiconductor device 320. Here, the semiconductor controller 300 includes a data generation unit 302, a command generation unit 304, a code generation unit 306, and a sensing unit 308. The semiconductor device 320 includes a data storage unit 321, a test operation unit 324, a test operation sensing signal generation unit 326, a data input buffer 322, and a mode register set (MRS) 323.

The semiconductor controller 300 outputs comparison data COMP_DATA having a data pattern set during a test preparation operation period and outputs a level test code TS_LVCD<0:N> in response to the voltage level of test data TS_DATA that is changed every set time during a test operation period. The semiconductor controller 300 senses a point in time when the level test code TS_LVCD<0:N> reaches a target value in response to a signal TS_SENS outputted from the semiconductor device 320.

If the command generation unit 304 of the semiconductor controller 300 generates a test preparation entry command TS_PENTRY and a test preparation exit command TS_PEXIT and subsequently provides the generated commands to the semiconductor device 320, the MRS 323 defines a test preparation operation period by determining whether or not the test preparation enable signal TS_PENABLE is activated in response to the test preparation entry command TS_PENTRY and the test preparation exit command TS_PEXIT.

Similarly, if the command generation unit 304 of the semiconductor controller 300 generates a test entry command TS_ENTRY and a test exit command TS_EXIT and subsequently provides the generated commands to the semiconductor device 320, the MRS 323 defines a test operation period by determining whether or not the test enable signal TS_ENABLE is activated in response to the test entry command TS_ENTRY and the test exit command TS_EXIT.

If the command generation unit 304 of the semiconductor controller 300 provides data EX_DATA generated by the data generation unit 302 to the semiconductor device 320 while providing a data input command WT to the semiconductor device 320, the data input buffer 322 of the semiconductor device 322 receives the data EX_DATA and buffers the received data EX_DATA. Additionally, the data buffered and outputted from the data input buffer 322 of the semiconductor device 322 becomes comparison data COMP_PDATA in the test preparation operation period and becomes test data TS_PDATA in the test operation period. More specifically, the comparison data COMP_PDATA applied from the semiconductor controller 300 and the test data TS_PDATA applied from the semiconductor controller 300 are divided according to when the data is applied from the semiconductor controller 300. Here, the comparison data COMP_PDATA and the test data TS_PDATA have a same data pattern.

The code generation unit 306 of the semiconductor controller 300 generates a level test code TS_LVCD<0:N> and provides the level test code TS_LVCD<0:N> to the semiconductor device 320. Additionally, the method of changing the value of the level test code TS_LVCD<0:N> is, for example, as follows.

First, the code generation unit 306 of the semiconductor controller 300 may sequentially increase the level test code TS_LVCD<0:N> from a minimum value to a target value and provide the level test code TS_LVCD<0:N> to the semiconductor device 320 as the level test code TS_LVCD<0:N> increases. Here, the target value is greater than the minimum value and identical to or smaller than a maximum value. Additionally, the data reference voltage output unit 3242 of the semiconductor device 320 changes the voltage level of a data reference voltage VREF_DQ from a minimum voltage level higher than a ground voltage VSS to a target voltage level lower than that of a power voltage VDD.

The code generation unit 306 of the semiconductor controller 300 may sequentially decrease the level test code TS_LVCD<0:N> from the maximum value to a target value and provide the level test code TS_LVCD<0:N> to the semiconductor device 320 as the level test code TS_LVCD<0:N> decreases. Here, the target value is smaller than the maximum value and identical to or greater than the minimum value. Additionally, the data reference voltage output unit 3243 of the semiconductor device 320 changes the voltage level of the data reference voltage VREF_DQ from the maximum voltage level lower than that of the power voltage VDD to a target voltage level higher than that of the ground voltage VSS.

The sensing unit 308 of the semiconductor controller 300 may sense a time taken until the level test code TS_LVCD<0: N> reaches the target value from the minimum or maximum value in response to the test entry command TS_ENTRY and the test operation sensing signal TS_SENS. The sensing method may be performed, for example, by sensing the time based on toggling of an operation clock or by generating an arbitrary clock having a frequency faster than that of the operation clock and sensing the time based on toggling of the arbitrary clock.

The data storage unit 321 of the semiconductor device 320 receives the comparison data COMP_DATA applied from the semiconductor controller 300 in the test preparation operation period, and swings the received comparison data COMP_PDATA with a set difference in voltage level so that the logic level of the swung data is distinguished from that of the comparison data COMP_PDATA.

Here, the data storage unit 321 includes a multi-purpose register 3212 and a data latch 3214.

Among the components of the data storage unit 321, the multi-purpose register 3212 stores the comparison data COMP_PDATA applied from the semiconductor controller 300 in the test preparation operation period.

Among the components of the data storage unit 321, the data latch 3214 latches the comparison data COMP_SDATA.

For reference, the comparison data may be divided into the comparison data COMP_PDATA applied from the semiconductor controller 300, the comparison data COMP_SDATA stored in the multi-purposed register 3212 of the semiconductor device 320, and the comparison data COMP_DATA latched through the data latch 3214 of the semiconductor device 320. These three comparison signals are for illustration purposes according to operation processes, and values of the three comparison signals are identical to one another. Hence, the comparison data will be referred to as comparison data COPM_DATA in the following description. The comparison data COMP_DATA may be a signal including a plurality of bits.

The test operation unit 324 of the semiconductor device 320 determines a logic level of the test data TS_PDATA applied from, the semiconductor controller 300 every set point in time in response to the logic level of the data reference voltage VREF_DQ. The test operation unit 324 generates a test result signal TS_RESULT by comparing the logic level of the comparison data COMP_DATA with the test data TS_DATA.

Here, the test operation unit 324 includes a data reference voltage output unit 3342, a logic level decision unit 3244, and a test result signal generation unit 3246.

Among the components of the test operation unit 324, the data reference voltage output unit 3242 determines the voltage level of the reference voltage VREF_DQ between a minimum voltage level, which is higher than that of the ground voltage VSS, and a maximum voltage level, which is lower than that of the power voltage VDD, in response to the level test code TS_LVCD<0:N> applied from the semiconductor controller 300 during the test operation period. For example, if the level test code TS_LVCD<0:N> is composed of a 6-bit code TS_LVCD<0:5> and has a minimum value, i.e., TS_LVCD<0:5>'000000', the data reference voltage output unit 142 sets the voltage level of the reference voltage VREF_DQ as the minimum voltage level. If the level test code TS_LVCD<0:N> has a maximum value, i.e., TS_LVCD<0:5>='111111', the data reference voltage output unit 142 sets the voltage level of the reference voltage VREF_DQ as the maximum voltage level. If the level test code TS_LVCD<0:N> has a middle value between the maximum and minimum values, e.g., TS_LVCD<0:5>='011111', the data reference voltage output unit 142 sets the voltage level of the reference voltage VREF_DQ as a voltage level obtained by halving the sum of the maximum voltage level and the minimum voltage level.

Among the components of the test operation unit 324, the logic level decision unit 3244 determines a logic level of test data TS_PDATA applied every point in time set in the test operation period in response to the voltage level of the reference voltage VREF_DQ.

More specifically, if the voltage level of the test data TS_PDATA applied every set point in time is higher than that of the data reference voltage VREF_DQ, the logic level decision unit 3244 sets the logic level of the outputted test data TS_DATA to be a logic high level. If the voltage level of the test data TS_PDATA applied every set point in time is lower than that of the data reference voltage VREF_DQ, the logic level decision unit 3244 sets the logic level of the outputted test data TS_DATA to be a logic low level.

The operations of the data reference voltage output unit 3242 and the logic level decision unit 3244 in the semiconductor device 320 will be described together.

As the value of the level test code TS_LVCD<0:N> applied from the semiconductor controller 300 is changed, the data reference voltage output unit 3242 also changes the voltage level of the data reference voltage VREF_DQ, and the logic level decision unit 3244 determines the logic level of the test data TS_DATA applied from the semiconductor controller 300 in response to the voltage level of the data reference voltage VREF_DQ.

Therefore, the logic level of the test data TS_DATA may be changed depending on the value of the level test code TS_LVCD<0:N> applied from the semiconductor controller 300.

For reference, the test data may be divided into the test data TS_PDATA, which is applied from the semiconductor controller 300, and the test data TS_DATA, which has a logic level determined by the logic level decision unit 3244. These two test data signals are for illustration purposes according to operation processes, and values of the signals are identical to one another. Hence, the test data will be referred to as test data TS_DATA in the following description. The test data TS_DATA may be a signal including a plurality of bits.

The test result signal generation unit 3246 of the semiconductor device 320 generates the test result signal TS_RESULT activated when the logic level of the test data TS_DATA outputted from the logic level decision unit 3244 is identical to that of the comparison data COMP_DATA stored in the data storage unit 321.

Referring back to FIG. 1C, a detailed circuit of the test result signal generation unit 3246 will be described. That is, when the logic levels of bits TS_DATA<1>, TS_DATA<2>, TS_DATA<3>, TS_DATA<4>, TS_DATA<5>, TS_DATA<6>, TS_DATA<7> and TS_DATA<8> of the test data TS_DATA respectively correspond to the logic levels of bits COMP_DATA<1>, COMP_DATA<2>, COMP_DATA<3>, COMP_DATA<4>, COMP_DATA<5>, COMP_DATA<6>, COMP_DATA<7> and COMP_DATA<8> of the comparison data COMP_DATA, respectively, the test result signal generation unit 146 activates the test result signal TS_RESULT initialized in an inactivation state.

For reference, FIG. 1C illustrates that each of the test data TS_DATA and the comparison data COMP_DATA is a signal composed of 8 bits. However, the circuit may be modified if the test data or the comparison data is a signal having more than 8 bits or less than 8 bits.

Although FIG. 1C illustrates that the bits of the test data TS_DATA are directly compared with those of the comparison data COMP_DATA, respectively, any comparison method may be included in the scope of the present invention as long as the comparison method is one in which the logic level of the test data TS_DATA, can be compared with that of the comparison data COMP_DATA. For example, a method of comparing a result obtained by compressing the test data TS_DATA composed of a plurality of bits with that obtained by compressing the comparison data COMP_DATA composed of a plurality of bits may be included in the scope of the present invention.

The operations of the data reference voltage output unit 3242, the logic level decision unit 3244 and the test result signal generation unit 3246 will be described together. As the value of the level test code TS_LVCD<0:N> is changed, the data reference voltage output unit 3242 also changes the voltage level of the data reference voltage VREF_DQ, and the logic level decision unit 3244 determines the logic level of the test data TS_DATA in response to the voltage level of the data reference voltage VREF_DQ. The test result signal generation unit 3246 compares the logic level of the test data TS_DATA with the logic level of the comparison data COMP_DATA and activates the test result signal TS_RESULT when the test data TS_DATA and the comparison data COMP_DATA are identical.

When the test data TS_DATA and the comparison data COMP_DATA are inputted from the semiconductor controller 300 through the data input buffer 322 as described above, the test data TS_DATA and the comparison data COMP_DATA have a same data pattern. Thus, when comparing voltage-level swing patterns of the test data TS_DATA and the comparison data COMP_DATA, the voltage-level swing patterns are identical to each other.

However, since the voltage-level swing of the comparison data COMP_DATA is made between the power voltage VDD and the ground voltage VSS, the logic level of the comparison data COMP_DATA is correctly decided. On the other hand, since the logic level of the test data TS_DATA is decided based on the voltage level of the data reference voltage VREF_DQ, which is fluctuated in response to the level test code TS_LVCD<0:N>, the logic level of the test data TS_DATA may be have a different value than the comparison data COMP_DATA depending on the value of the level test code TS_LVCD<0:N>.

Therefore, where the comparison data COMP_DATA and the test data TS_DATA, which have had the same voltage-level swing pattern when being inputted from the semiconductor controller 300, have different logic levels, the voltage level of the data reference voltage VREF_DQ for deciding the logic level of the test data TS_DATA is in an incorrect state. On the contrary, where the comparison data COMP_DATA and the test data TS_DATA, which have had the same voltage-level swing pattern when being inputted from the semiconductor controller 300, have the same logic level, the voltage level of the data reference voltage VREF_DQ for deciding the logic level of the test data TS_DATA is in a correct state.

More specifically, when the test result signal TS_RESULT outputted from the test result signal generation unit 3246 of the semiconductor device 320 is not activated means that the data reference voltage VREF_DQ has an abnormal level. On the contrary, when the test result signal TS_RESULT outputted from the test result signal generation unit 146 is activated means that the data reference voltage VREF_DQ has a normal level.

In other words, when the test result signal TS_RESULT outputted from the test result signal generation unit 3246 of the semiconductor device 320 is not activated means that the level test code TS_LVCD<0:N> has an abnormal value. On the contrary, when the test result signal TS_RESULT outputted from the test result signal generation unit 146 is activated means that the level test code TS_LVCD<0:N> has a normal value.

The test operation sensing signal generation unit 326 of the semiconductor device 320 generates a test operation sensing signal TS_SENS that is activated in response to the test entry command TS_ENTRY and inactivated in response to the test result signal TS_RESULT.

Referring back to FIG. 1D, a detailed circuit of the test operation sensing signal generation unit 326 will be described. Specifically, the test operation sensing signal generation unit 326 includes PMOS transistors P1 and P2, and NMOS transistors N1 and N2. The PMOS transistors P1 and P2 determine that the test operation sensing signal TS_SENS is inactivated to a logic high level in response to the test result signal TS_RESULT in the test operation period when the test enable signal TS_ENABLE is activated. The NMOS transistors N1 and N2 determine that the test operation sensing signal TS_SENS is activated to a logic low level in response to the test entry command TS_ENTRY in the test operation period when the test enable signal TS_ENABLE is activated.

Thus, the test operation sensing signal generation unit 326 allows the test operation sensing signal TS_SENS, which is inactivated to a logic high level in an initial state, to be activated to a logic low level in response to the test entry command TS_ENTRY toggled as a logic high level. The test operation sensing signal generation unit 326 allows the test operation sensing signal TS_SENS to be inactivated to a logic high level in response to the test result signal TS_RESULT toggled as a logic low level.

The transition of the test operation sensing signal TS_SENS from the activation state of a logic low level to the inactivation state of a logic high level means that the data reference voltage VREF_DQ is changed from the state where the data reference voltage VREF_DQ has an abnormal level to the state where the data reference voltage VREF_DQ has a normal level.

In other words, the transition of the test operation sensing signal TS_SENS from the activation state of a logic low level to the inactivation state of a logic high level means that the level test code TS_LVCD<0:N> is changed from the state where the level test code TS_LVCD<0:N> has an abnormal value to the state where the level test code TS_LVCD<0:N> has a normal value.

Since the test operation sensing signal TS_SEN is activated to a logic low level at the time when the test entry command TS_ENTRY is toggled to a logic high level, the period from the point in time when the test operation sensing signal TS_SENS is activated to a logic low level to the point in time when test operation sensing signal TS_SENS is inactivated to a logic high level is a period when a training test is performed on the value of the level test code TS_LVCD<0:N> and the level of the data reference voltage VREF_DQ.

The training test is performed to identify which value of the level test code TS_LVCD<0:N> has as the normal value while sequentially changing the value of the level test code TS_LVCD<0:N> within a specific range of values.

Similarly, the training test is performed to identify which voltage level the data reference voltage VREF_DQ has as the normal voltage level while sequentially changing the voltage of the data reference voltage VREF_DQ within a specific range of voltage levels.

As a result, the length of the activation period of the test operation sensing signal TS_SENS may be a time when the voltage level of the data reference voltage VREF_DQ reaches a target level through the training test.

The configuration of the semiconductor system illustrated in FIG. 3B is almost identical to that of the semiconductor system illustrated in FIG. 3A. However, in the semiconductor system illustrated in FIG. 3B, an activation period counter 329 is further included in the semiconductor device 320, and a counting-time table 309 in place of the sensing unit 308 is included in the semiconductor controller 300.

Specifically, the activation period counter 329 of the semiconductor device 320 counts the number of times when a source clock CLK is toggled during the activation period of the test operation sensing signal TS_SENS and subsequently outputs the counted value TS_CNT to the semiconductor controller 300 through a set output pad PAD.

A time taken until the value of the level test code TS_LVCD<0:N> reaches a target value is represented by a counted value TS_CNT. The counted value TS_CNT is provided from the semiconductor device 320 and is previously sensed by the activation period counter 329 and stored in the counting-time table 309 of the semiconductor controller 300. If the counted value TS_CNT is provided from the semiconductor device 320, the time taken until the value of the level test code TS_LVCD<0:N> reaches the target value can be immediately sensed.

As described above, in the semiconductor device for generating a data reference voltage VREF_DQ and deciding a logic level of data applied from a circuit outside of the semiconductor device, a result obtained by performing a training test on a change in voltage level of the data reference voltage VREF_DQ can be converted into the length of the activation period of an output pulse, and the converted length can be outputted to a circuit outside of the semiconductor device.

More specifically, when a parameter, which has a very small unit such as a time when the voltage level of the data reference voltage VREF_DQ reaches a target level, is sensed in a circuit outside of the semiconductor device, the length of the activation period of a pulse outputted from the semiconductor device may be sensed. Thus, the sensed result is not influenced by capacitive and loading elements of a monitoring pad and sensing equipment.

Thus, a parameter having a very small unit can be very precisely sensed at a circuit outside of the semiconductor device.

Further, when sensing the length of the activation period of a pulse outputted from the semiconductor device, the length of the activation period of the pulse can be precisely sensed as an operation frequency to be sensed increases. Thus, a stable sensing operation may be performed even when the operation frequency of the semiconductor system is very high.

While the present invention has been described with respect to the specific embodiments, it will be apparent to those skilled in the art that various changes and modifications may be made without departing from the spirit and scope of the invention as defined in the following claims.

For example, the position and type of each of the logic gates and the transistors, illustrated in the aforementioned embodiments of the present invention, may be variously implemented according to the polarity of a signal inputted thereto.

What is claimed is:

1. A semiconductor device comprising:
a data storage unit configured to receive input data, output the input data with a first difference in voltage level between logic levels, and output comparison data whose logic level is distinguished from that of the input data;
a test operation unit configured to determine a logic level of test data periodically in response to a data reference voltage whose voltage level is determined in response to a level test code during a test operation period defined by a test entry command and a test exit command, and generate a test result signal by comparing a logic level of the comparison data with the logic level of the test data; and
a test operation sensing signal generation unit configured to generate a test operation sensing signal that is activated in response to the test entry command and inactivated in response to the test result signal.

2. The semiconductor device of claim 1, further comprising an output pad configured to output the test operation sensing signal.

3. The semiconductor device of claim 1, further comprising:
an activation period counter configured to count the number of times that a source clock is toggled during an activation period of the test operation sensing signal; and
an output pad configured to output a value counted by the activation period counter.

4. The semiconductor device of claim 1, wherein the data storage unit comprises:
a multi-purpose register configured to store the input data applied in a test preparation operation period; and
a data latch configured to latch the input data stored in the multi-purpose register between a power voltage and a ground voltage and output the comparison data.

5. The semiconductor device of claim 1, wherein the test operation unit comprises:
a data reference voltage output unit configured to determine the voltage level of the data reference voltage between a minimum voltage level and a maximum voltage level in response to the level test code;
a logic level decision unit configured to determine the logic level of the test data periodically applied in the test operation period in response to the voltage level of the data reference voltage; and
a test result signal generation unit configured to generate the test result signal that is activated when a logic level of an output of the logic level decision unit is identical to that of the comparison data.

6. The semiconductor device of claim 5 wherein the minimum voltage level is higher than the ground voltage and the maximum voltage level is lower than the power voltage.

7. A semiconductor system comprising:
a semiconductor controller configured to output comparison data during a test preparation operation period, output a level test code whose value is periodically changed and test data during a test operation period, and sense a time taken for the level test code to reach a target value in response to an output signal of a semiconductor device; and
the semiconductor device configured to store a logic level of the comparison data during the test preparation operation period, determine a voltage level of a data reference voltage in response to the level test code during the test operation period, decide a logic level of the test data in response to the data reference voltage, and generate the output signal by comparing the logic level of the test data with the logic level of the comparison data,
wherein the semiconductor device comprises:
a data storage unit configured to receive the comparison data applied in the test preparation operation period outputs the input data with a first difference in voltage level between logic levels, and output the swung comparison data whose logic level is distinguished from the received comparison data;
a test operation unit configured to determine the voltage level of the data reference voltage in response to the level test code during the test operation period, decide the logic level of the test data in response to the data reference voltage, and generate a test result signal by comparing the logic level of the test data with the logic level of the comparison data; and
a test operation sensing signal generation unit configured to generate a test operation sensing signal as the output signal that is activated in response to a test entry command and inactivated in response to the test result signal.

8. The semiconductor system of claim 7, wherein the semiconductor controller defines the test preparation operation period by generating test preparation entry/exit commands and providing the generated test preparation entry/exit commands to the semiconductor device, and the semiconductor controller defines the test operation period by generating test entry/exit commands and providing the generated test entry/exit commands to the semiconductor device.

9. The semiconductor system of claim 7, wherein the semiconductor device further comprises an output pad configured to output the test operation sensing signal to the semiconductor system.

10. The semiconductor system of claim 9, wherein the semiconductor system senses a time from the point in time when the test entry command is generated to the point in time when the test operation sensing signal provided from the semiconductor device is inactivated and sets the sensed time as a time taken until the level test code reaches the target value.

11. The semiconductor system of claim 7, wherein the semiconductor device further comprises:

an activation period counter configured to count the number of times that a source clock is toggled during an activation period of the test operation sensing signal; and an output pad configured to output a value counted by the activation period counter to the semiconductor system.

12. The semiconductor system of claim 10, wherein the semiconductor system calculates the time taken until the level test code reaches the target value corresponding to the counted value provided from the semiconductor device in response to a counting-time table containing determined values.

13. The semiconductor system of claim 7, wherein the data storage unit comprises:

a multi-purpose register configured to store the comparison data applied from the semiconductor controller during the test preparation operation period; and a data latch configured to latch the comparison data stored in the multi-purpose register between a power voltage and a ground voltage.

14. The semiconductor system of claim 7, wherein the test operation unit comprises:

a data reference voltage output unit configured to change the voltage level of the data reference voltage whenever a value of the level test code applied from the semiconductor controller is changed during the test operation period and output the changed voltage level of the data reference voltage;

a logic level decision unit configured to determine the logic level of the test data periodically applied from the semiconductor controller during the test operation period in response to the voltage level of the data reference voltage outputted from the data reference voltage output unit; and a test result signal generation unit configured to generate the test result signal that is activated when the logic level of an output of the logic level decision unit is identical to the comparison data.

15. The semiconductor system of claim 14, wherein the data reference voltage output unit changes the voltage level of the reference voltage level from a first minimum voltage level higher than a ground voltage to a target voltage level lower than a power voltage while the semiconductor controller increases the value of the level test code from a second minimum value to a value that is greater than the second minimum value and identical to or smaller than a maximum value.

16. The semiconductor system of claim 14, wherein the data reference voltage output unit changes the voltage level of the reference voltage level from a first maximum voltage level lower than a power voltage to a target voltage level higher than a ground voltage while the semiconductor controller decreases the value of the level test code from a second maximum value to a value that is smaller than the second maximum value and identical to or greater than a minimum value.

17. A method for operating a semiconductor system, the method comprising:

entering a test preparation period of a semiconductor device in response to a test preparation entry command, comparison data, and a test preparation exit command from a semiconductor controller, storing the comparison data by controlling logic levels of the comparison data in the semiconductor device, and exiting from the test preparation operation period of the semiconductor device;

outputting a test entry command from the semiconductor controller, outputting a level test code having a value that is periodically changed and test data corresponding to the number of periods from the semiconductor controller, and outputting a test exit command from the semiconductor controller after a test operation of outputting a test entry command;

periodically determining a voltage level of a data reference voltage in the semiconductor device in response to the level test code and the test data in a test operation period that is defined in response to the test entry command and the test exit command, deciding a logic level of the test data based on the data reference voltage in the semiconductor device, and outputting a test operation sensing signal from the semiconductor device by comparing the logic level of the test data with the comparison data; and determining a time taken until the value of the level test code reaches a target value in the semiconductor controller in response to the test operation sensing signal.

18. The method of claim 17, wherein the comparing of the logic level of the test data with the comparison data by the semiconductor device comprises:

changing the voltage level of the data reference voltage whenever the value of the level test code is changed in the semiconductor controller;

determining the logic level of the test data in response to the voltage level of the data reference voltage;

generating a test result signal activated when the determined logic level of the test data is identical to that of the comparison data; and generating the test operation sensing signal that is activated in response to the test entry command and inactivated in response to the test result signal.

19. The method of claim 18, wherein the comparing of the logic level of the test data with that of the comparison data further comprises:

providing the test operation sensing signal to the semiconductor controller through an output pad.

20. The method of claim 19, wherein, in the determining of the time taken until the value of the level test code reaches the target value, the semiconductor controller senses a time from a point in time when the test entry command is generated in the semiconductor controller to a point in time when the inactivated test operation sensing signal is provided from the semiconductor device and sets the sensed time as the time taken for the value of the level test code reaches the target value.

21. The method of claim 18, wherein the comparing of the logic level of the test data with that of the comparison data by the semiconductor device comprises:

counting the number of times when a source clock is toggled during the activation period of the test operation sensing signal; and providing the counted value to the semiconductor controller through an output pad.

22. The method of claim 21, wherein, in the determining of the time taken until the value of the level test code reaches the target value, the semiconductor device calculates the time taken until the level test code reaches the target value corresponding to the counted value provided from the semiconductor device in response to a counting-time table containing determined values.

23. The method of claim 18, wherein, in the changing of the voltage level of the data reference voltage, the semiconductor device changes the voltage level of the reference voltage level from a first minimum voltage level higher than a ground voltage to a target voltage level lower than a power voltage while the semiconductor controller increases the value of the level test code from a second minimum value to a value greater than the second minimum value the value identical to or smaller than a maximum value.

24. The method of claim 18, wherein, in the changing of the voltage level of the data reference voltage, the semiconductor device changes the voltage level of the reference voltage level from a first maximum voltage level lower than a power voltage to a target voltage level higher than a ground voltage while the semiconductor controller decreases the value of the level test code from a second maximum value to a value smaller than the second maximum value the value identical to or greater than a minimum value.

\* \* \* \* \*